(12) United States Patent
Abouda et al.

(10) Patent No.: US 9,482,711 B2
(45) Date of Patent: *Nov. 1, 2016

(54) APPARATUS AND A METHOD FOR DETECTING FAULTS IN THE DELIVERY OF ELECTRICAL POWER TO ELECTRICAL LOADS

(71) Applicants: Kamel Abouda, Saint Lys (FR); Stephanie Creveau-Boury, Toulouse (FR); Murielle Delage, Fonsorbes (FR); Pierre Turpin, Toulouse (FR)

(72) Inventors: Kamel Abouda, Saint Lys (FR); Stephanie Creveau-Boury, Toulouse (FR); Murielle Delage, Fonsorbes (FR); Pierre Turpin, Toulouse (FR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 464 days.

This patent is subject to a terminal disclaimer.

(21) Appl. No.: 14/094,097

(22) Filed: Dec. 2, 2013

(65) Prior Publication Data

US 2014/0084940 A1 Mar. 27, 2014

Related U.S. Application Data

(63) Continuation of application No. 12/920,600, filed as application No. PCT/IB2008/052209 on Mar. 20, 2008, now Pat. No. 8,598,886.

(51) Int. Cl.
*G01R 31/08* (2006.01)
*G01R 31/02* (2006.01)
*G01R 31/00* (2006.01)

(52) U.S. Cl.
CPC ............ *G01R 31/025* (2013.01); *G01R 31/007* (2013.01); *G01R 31/024* (2013.01)

(58) Field of Classification Search
CPC .... G01R 31/02; G01R 31/025; G01R 31/08; G01R 31/024
USPC ......................................... 324/527, 538, 522
See application file for complete search history.

(56) References Cited

U.S. PATENT DOCUMENTS

| 5,161,112 | A | 11/1992 | Guerra et al. |
| 5,515,278 | A | 5/1996 | Niggemann et al. |
| 5,638,004 | A | 6/1997 | Combs et al. |
| 6,462,557 | B1 | 10/2002 | Milansi et al. |
| 7,336,046 | B2 | 2/2008 | Yasue |
| 7,667,940 | B2 | 2/2010 | Turpin et al. |
| 8,598,886 | B2 * | 12/2013 | Abouda ............... G01R 31/007 324/522 |
| 2007/0210804 | A1 | 9/2007 | Endoh |
| 2008/0212246 | A1 * | 9/2008 | Tanaka ................... H02H 3/087 361/86 |

FOREIGN PATENT DOCUMENTS

EP 0418665 A 3/1991

* cited by examiner

*Primary Examiner* — Amy He
(74) *Attorney, Agent, or Firm* — Charlene R. Jacobsen

(57) ABSTRACT

A method of and apparatus for fault detection utilizing a diagnostic procedure by a diagnostic device to detect a short circuit between at least two of a plurality of load electrical connections, the diagnostic procedure comprising applying a test electrical signal to each of the load electrical connections in turn and while applying the test electrical signal to a first one of the load electrical connections, detecting whether an electrical output is present, in response, on any other of the load electrical connections, wherein the detecting by the diagnostic device includes applying the test electrical signal to the first one of the load electrical connections in an operational mode of the apparatus when an electrically controlled switch connected to the first one of the load electrical connections is in an off state.

20 Claims, 5 Drawing Sheets

APPARATUS AND A METHOD FOR DETECTING FAULTS IN THE DELIVERY OF ELECTRICAL POWER TO ELECTRICAL LOADS

CROSS-REFERENCE TO RELATED APPLICATION(S)

This application is a continuation of U.S. patent application Ser. No. 12/920,600, entitled "APPARATUS AND A METHOD FOR DETECTING FAULTS IN THE DELIVERY OF ELECTRICAL POWER TO ELECTRICAL LOADS," filed on Sep. 2, 2010, which is a National Stage Entry under 37 C.F.R. §371 of PCT/IB2008/052209, filed Mar. 20, 2008, the disclosures of which are hereby expressly incorporated by reference in their entirety.

FIELD OF THE DISCLOSURE

This invention relates to relates to apparatus and a method for detecting faults in the delivery of electrical power to electrical loads. The apparatus and method are useful particularly but not exclusively in automotive electrical control applications.

BACKGROUND

In some applications such as in a motor vehicle, a single electrical power source is employed to energise multiple electrical loads each via its own output connection. An electronic smart switch module, e.g. comprising one or more pre-programmed semiconductor integrated circuit chips, may be employed to control switching of each of the loads between an 'On' (energised) state and an 'Off' (unenergised) state as required.

In the prior art, smart switch modules are known which are able to diagnose certain faults such as a short circuit connection, herein referred to as a 'short', to the power source leaving an output connection to a load in an 'open load' condition in which the load is unenergised.

SUMMARY

The present invention provides apparatus and a method for detecting faults in the delivery of electrical power to electrical loads as defined in the accompanying claims.

Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the accompanying drawings. Elements in the figures are illustrated for simplicity and clarity and have not necessarily been drawn to scale.

DETAILED DESCRIPTION OF THE DRAWINGS

Embodiments of the invention to be described include apparatus and a method for detecting faults in the delivery of electrical power to electrical loads. The apparatus includes a plurality of load or output electrical connections arranged to deliver electrical power from an electrical power source to each of a plurality of electrical loads and a diagnostic device operable to detect a short circuit fault in the apparatus. The diagnostic device is operable to detect a short circuit between at least two of the load electrical connections by applying a diagnostic procedure which includes: (i) applying a test electrical signal, e.g. an energising voltage, to each of the load electrical connections in turn; and (ii) whilst applying the test electrical signal, detecting whether an electrical output, a voltage, is present in response on any of the other load electrical connections.

Figure 1:
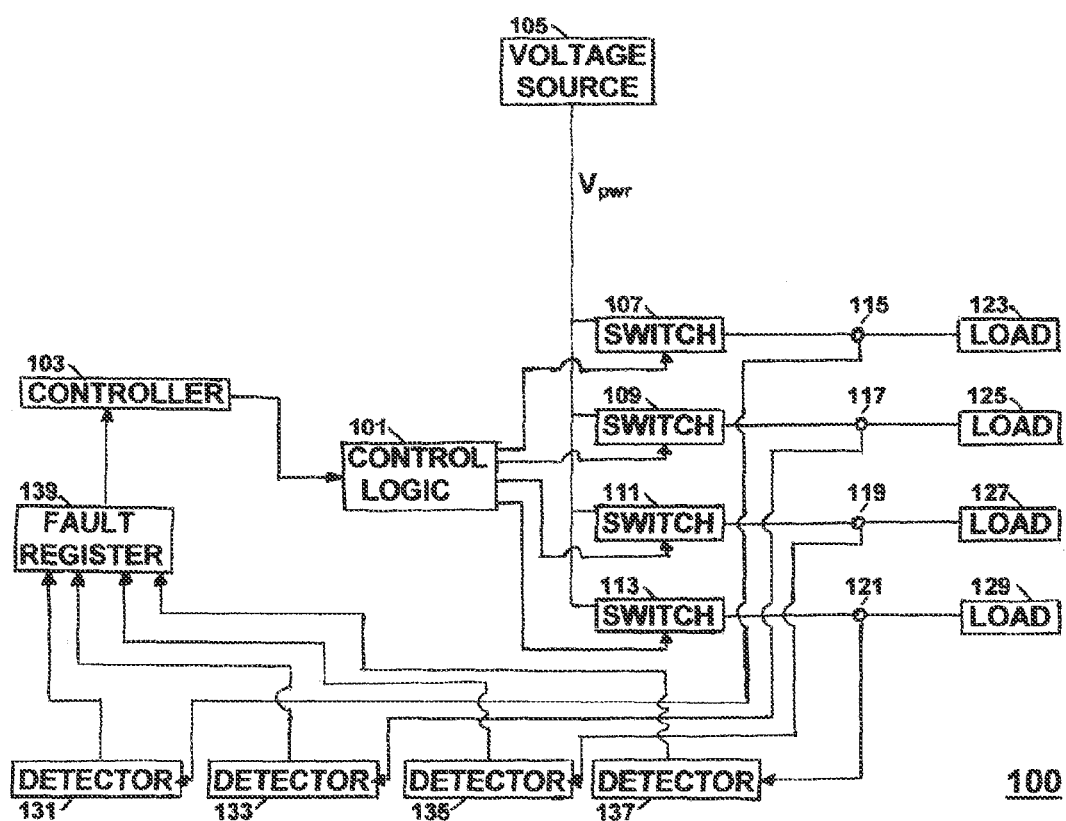
FIG. 1 is a block schematic diagram of an illustrative apparatus for electrical power delivery and fault diagnosis in accordance with an embodiment of the invention.

FIG. 1 is a schematic block circuit diagram of an illustrative apparatus 100 embodying the invention. The apparatus 100 may include a control logic unit 101 operating under control of a controller 103, e.g. a microcontroller. The control logic unit 101 is connected so that it may control a plurality of electrically controlled switches including switches 107, 109, 111 and 113. The switches 107, 109, 111 and 113 may for example be transistor switches such as switches capable of being incorporated in a semiconductor integrated circuit, e.g. power MOSFET (metal-oxide-semiconductor field effect transistor) switches. The switches 107, 109, 111 and 113 may be connected to a voltage source 105 providing an energising output voltage Vpwr. The voltage source 105 may for example be a battery or an a.c. to d.c. converter. Each of the switches 107, 109, 111 and 113 may also be connected to a corresponding load via a corresponding output load connection. The loads may include a load 123 connected to the switch 107, a load 125 connected to the switch 109, a load 127 connected to the switch 111 and a load 129 connected to the switch 113. The loads 123 to 129 may for example be electrical lights such as light bulbs or light emitting diodes, or other electrically driven components such as in a motor vehicle or other application host. The output connection between each of the switches and each of the loads may include a connection point at which a connection is made to a corresponding detector. Thus, an output connection between the switch 107 and the load 123 may include a connection point 115 at which a connection is made to a detector 131. Similarly, an output connection between the switch 109 and the load 125 may include a connection point 117 at which a connection is made to a detector 133. Similarly, an output connection between the switch 111 and the load 127 may include a connection point 119 at which a connection is made to a detector 135. Similarly, an output connection between the switch 113 and the load 129 may include a connection point 121 at which a connection is made to a detector 137.

The control unit 101 and the detectors 131 to 137 comprise the diagnostic device referred to above. When suitable test control signals are issued by the control unit 101, the detectors 131 to 137 are able to detect, in a manner described in more detail later, whether a short exists between the output connection to which the detector is connected and another output connector, which is one of the other output connectors selected in turn. When such a short is detected, a fault signal is delivered by the detector which detects the short to a fault register 139 and also to the controller 103 to indicate the fault condition of the apparatus 100 caused by the detected short.

In normal operation, control signals from the control logic unit 101 may be applied to control whether the switches 107 to 113 are conducting or not. As the control signals may be passed through switch drivers (not shown) to put each of the switches 107 to 113 in a selected state, e.g. either 'On' (conducting) or 'Off' (non-conducting), and to switch between the states. Where one of the switches 107 to 113 is put in its On state, the corresponding one of the loads 123 to 129 which is connected to that switch is put into the 'On' state by being energised by an energising voltage derived from the voltage Vpwr from the voltage source 105. Where one of the switches 107 to 113 is put in its Off state, the corresponding one of the loads 123 to 129 connected to that switch is put into the 'Off' or unenergised state by being disconnected from the voltage Vpwr from the voltage source 105.

For an example, the control unit 101 and the detectors 131 to 137 are employed in an 'outputs connected' diagnostic mode of the apparatus 100 to detect whether there is a fault in operation of the apparatus 100 caused by at least two of the output connections to the loads 123 to 129 being shorted together. The 'outputs connected' diagnostic mode may be applied periodically, e.g. at regular intervals, e.g. whenever a fault detecting mode to search for shorts of the output connections direct to the voltage source 105 is applied. Alternatively, or in addition, the 'outputs connected' diagnostic mode may be applied on occasions when selected, e.g. by generation of a signal to initiate the mode by the controller 103. The controller 103 may generate such a signal by receipt by the controller 103 of a signal indicating selection of the 'outputs connected' diagnostic mode by an operator of the apparatus 100.

The detectors 131 to 137 are shown in FIG. 1 as separate units. It should be noted that two or more of the detectors 131 to 137 could in practice be combined in a single detector unit operated in separate detection modes for each of the different connection points investigated.

Figure 2:
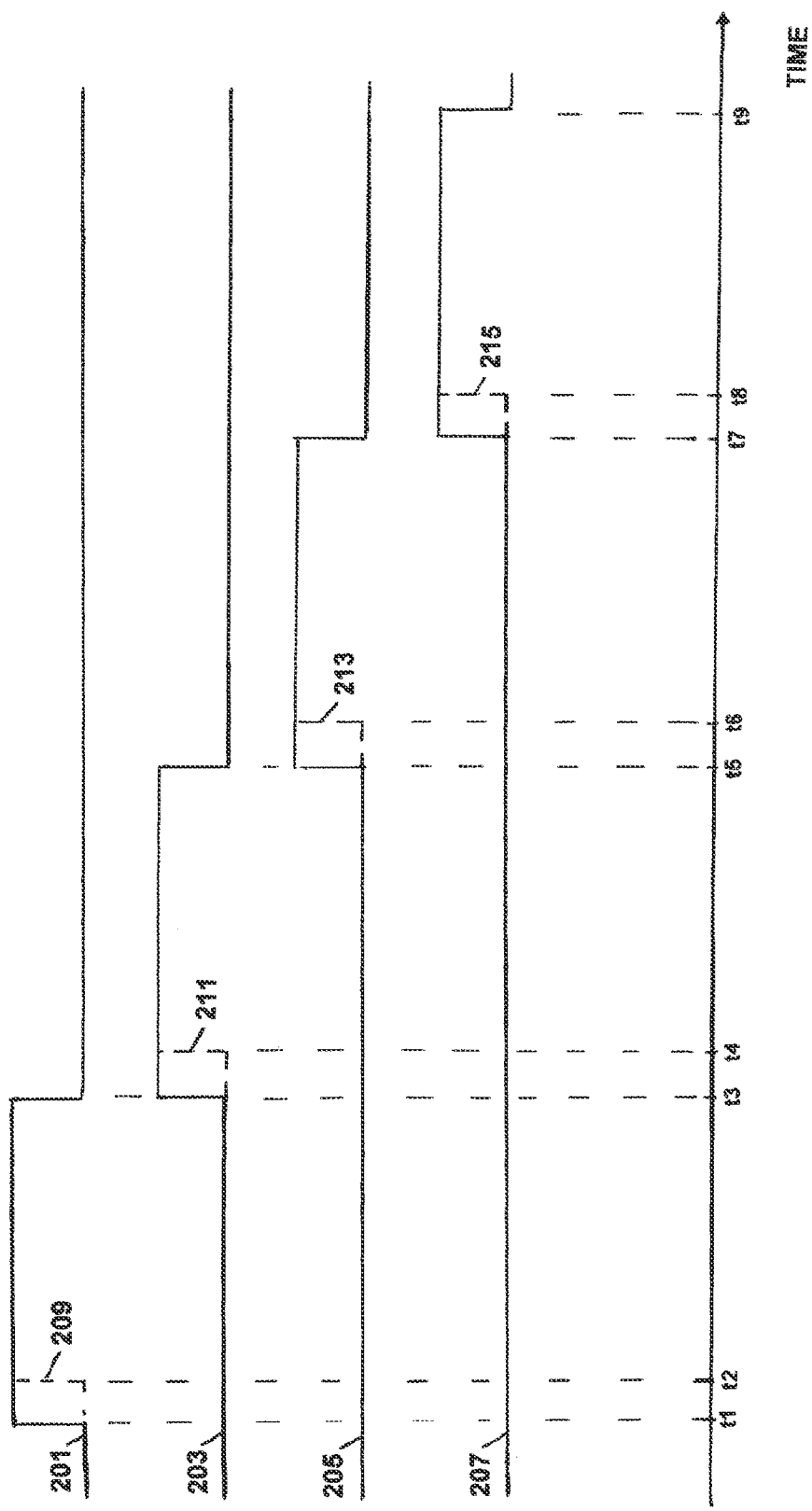
FIG. 2 is a waveform timing diagram illustrating operation of the apparatus of FIG. 1.

FIG. 2 is a waveform diagram illustrating operation of the 'outputs connected' diagnostic mode. For simplicity, it assumed initially that none of the outputs is 'On' and that no fault exists. A waveform 201 represents a control signal applied by the control logic unit 101 to the switch 107. A voltage appearing in response at the connection point 115 has a similar form. A waveform 203 represents a control signal applied to the switch 109. A voltage appearing in response at the connection point 117 has a similar form. A waveform 205 represents a control signal applied to the switch 111. A voltage appearing in response at the connection point 119 has a similar form. A waveform 207 represents a control signal applied to the switch 113. A voltage appearing in response at the connection point 121 has a similar form.

At a time t1, the switch 107 (FIG. 1) is turned On by the control signal from the control logic unit 101 having the waveform 201, as indicated by a step rise in the waveform 201, resulting in an energising voltage derived from Vpwr being developed at the connection point 115. At a time t2 which is a short delay period after the time t1, each of the detectors 133 to 137 connected respectively to the other connection points 117 to 121 is activated to detect whether the respective connection point is also connected to the voltage Vpwr. Initiation of the activation of the detectors 117 to 121 at the time t2 is indicated by a dashed line 209. Operation of the detectors 131 to 137 is described in more detail later with reference to FIG. 3. At a time t3, the switch 107 is turned Off again, as indicated by a step fall in the waveform 201. Activation of the detectors 133 to 137 also stops at the time t3.

At the time t3, the switch 109 (FIG. 1) is turned On by a control signal from the control logic unit 101 having the waveform 203, as indicated by a step rise in the waveform 203, resulting in an energising voltage derived from the voltage Vpwr being developed at the connection point 117. At a time t4 which is a short delay period after the time t3, each of the detectors 131, 135 and 137 connected respectively to the other connection points 115, 119 and 121 is activated to detect whether the respective connection point is also connected to the voltage Vpwr. Initiation of activation of the detection by the detectors 131, 135 and 137 is indicated by a dashed line 211. At a time t5, the switch 109 is turned Off again as indicated by a step fall in the waveform 203. Activation of the detectors 131, 135 and 137 also stops at the time t5.

At the time t5, the switch 111 (FIG. 1) is turned On by a control signal from the control logic unit 101, as indicated by a step rise in the waveform 205, resulting in an energising voltage derived from the voltage Vpwr being developed at the connection point 119. At a time t6 which is a short delay period after the time t5, each of the detectors 131, 133 and 137 connected respectively to the other connection points 115, 117 and 121 is activated to detect whether the respective connection point is also connected to the voltage Vpwr. Initiation of the activation of detection by the detectors 131, 133 and 137 is indicated by a dashed line 213. At a time t7, the switch 111 is turned Off again as indicated by a step fall in the waveform 205. Activation of the detectors 131, 133 and 137 also stops at the time t7.

At the time t7, the switch 113 (FIG. 1) is turned On by a control signal from the control logic unit 101 having the waveform 207, as indicated by a step rise in the waveform 207, resulting in an energising voltage derived from the voltage Vpwr being developed at the connection point 121. At a time t8 which is a short delay period after the time t7, each of the detectors 131, 133 and 135 connected respectively to the other connection points 115, 117 and 119 is activated to detect whether the respective connection point is also connected to the voltage Vpwr. Initiation of the activation of detection by the detectors 131, 133 and 135 is indicated by a dashed line 215. At a time t9, the switch 113 is turned Off again as indicated by a step fall in the waveform 207. Activation of the detectors 131, 133 and 135 also stops at the time t7.

The delay period between turning On a switch connected to a given output connection and initiating detection at the other outputs, e.g. between the time t3 and the time t4, is a blanking period selected so that, following turning On of the relevant switch, the relevant detectors become suitably activated, especially where they were previously activated then de-activated at a time which coincided with the turning On of the switch, e.g. at the time t3. The delay period selected depends on the particular implementation of the apparatus 100. A typical illustrative value of the delay period is 10 microseconds.

Figure 3:
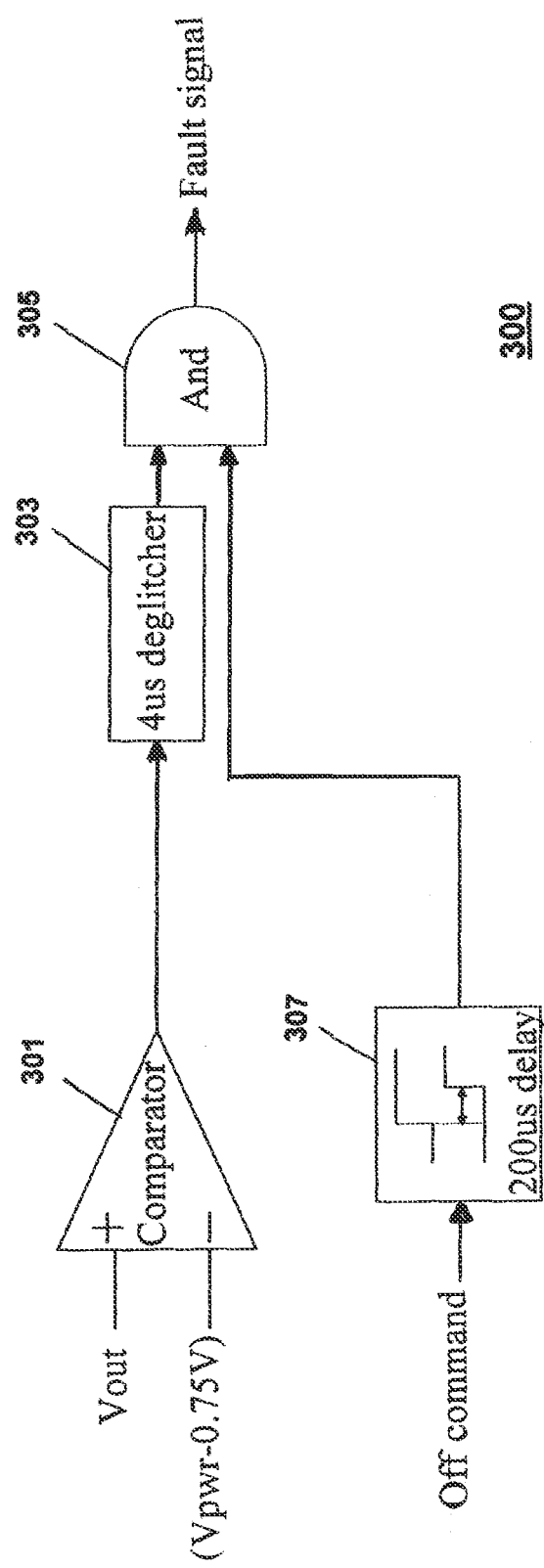
FIG. 3 is an illustrative arrangement for use as a detector in the apparatus of FIG. 1.

FIG. 3 is a schematic diagram illustrating an arrangement 300 useful in each of the detectors 131 to 137. As noted earlier, the purpose of each of the detectors 131 to 137 is to detect whether the corresponding output connection to which the detector is connected is shorted to Vpwr, especially when another output connection is connected to Vpwr. The arrangement 300 may include a comparator 301 which receives as a first input the output voltage Vout which appears at the relevant connection point to which the detector is connected. Where the arrangement 300 is employed in the detector 131, Vout is the voltage appearing at the connection point 115. Where the arrangement 300 is employed in the detector 133, Vout is the voltage appearing at the connection point 117. Where the arrangement 300 is employed in the detector 135, Vout is the voltage appearing at the connection point 119. Where the arrangement 300 is employed in the detector 137, Vout is the voltage appearing at the connection point 121. The comparator 301 receives as a second input a fixed threshold voltage illustrated in FIG. 3 to be a voltage Vpwr—0.75 volts. As noted earlier, Vpwr is the voltage provided by the voltage source 105. The illustrative voltage 0.75 volts is a voltage drop equivalent to the voltage drop across each of the switches 107 to 113 when conducting. The comparator 301 produces an output signal only when the detected voltage Vout is greater than the threshold voltage Vpwr—0.75 volts. The output signal may be passed through a deglitcher 303 illustratively shown in FIG. 3 to be a 4 microsecond deglitcher. The purpose of the deglitcher 303 is to filter the output signal from the comparator 301 to remove rapid signal variations to avoid fault detection due to intermittent glitches or spikes. When an output signal is produced by the deglitcher 303 it may be applied to an And gate 305.

The arrangement 300 may be activated by a control signal issued by the control logic unit 101 which produces an 'Off command' to turn Off the switch connected to the relevant connection point. For example, where the arrangement 300 is included in the detector 131 connected to the connection point 115, the 'Off command' signal is applied to put the switch 107 temporarily in its Off state so that the switch 107 does not provide a direct connection between the voltage source 105 and the connection point 115. The 'Off command' signal is applied in the arrangement 300 to a delay unit 307 which in FIG. 3 is shown to apply an illustrative delay of 200 microseconds to the applied 'Off command' signal. The delay applied corresponds to a period required to allow the output voltage to fall to a suitably low level if the switch to which 'Off command' signal is applied is in an On state when the 'Off command' signal is applied. The delayed signal produced by the delay unit 307 is applied to the And gate 305.

The And gate 305 produces an output signal only when it receives an input signal at both of its inputs co-incidentally. Where such an output signal is produced it indicates that the voltage Vout at the relevant connection point is high when it should be low. It should be low because the corresponding switch connected to the output at that point has been turned Off by the 'Off command' signal. Thus, an output signal produced by the And gate 305 is a fault signal indicating detection of a short between the voltage source 105 and the relevant output. Using an illustrative method 500 to be described later with reference to FIG. 5, it can be shown that the detected short to the voltage source 105 in the diagnostic mode as described earlier appears only when another one of the outputs is turned On, as described earlier with reference to the waveforms 201 to 207 shown in FIG. 2. Thus, the output signal indicates a short between the investigated output connection, e.g. the connection point 115, connected to the detector incorporating the arrangement 300 and the other output connection, e.g. the connection point 117, whose switch, e.g. switch 109, has been turned On.

If the And gate 305 produces no output signal it indicates that no fault due to shorting of output connections is present.

Figure 4:
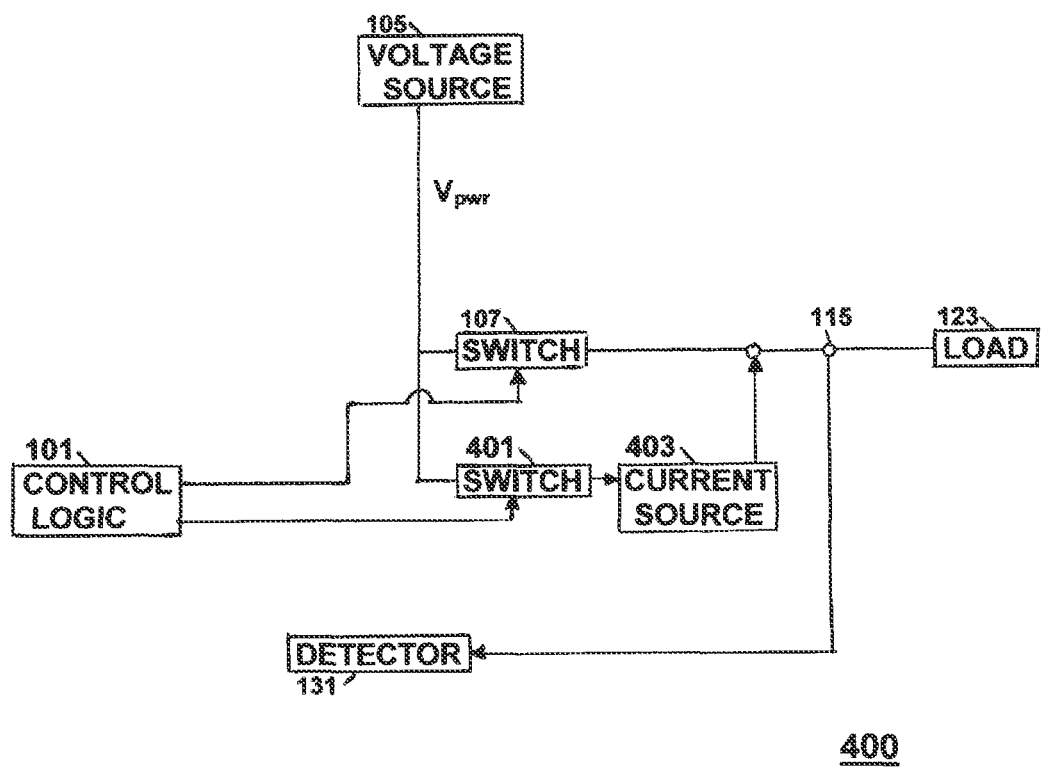
FIG. 4 is a block schematic diagram of an apparatus embodying the invention which is a modification of the apparatus of FIG. 1.

FIG. 4 is a block schematic diagram illustrating an apparatus 400. The apparatus 400 is a modified form of the apparatus 100 of FIG. 1. The apparatus 400 is adapted for use in applying the 'outputs connected' diagnosis mode when the apparatus 400 is in active operational use, i.e. one or more of the loads is already energised in the 'On state'. Components shown in FIG. 4 having the same reference numerals as components in FIG. 1 have the same function as those components. Although the modified form 400 may include all of the components shown in FIG. 1, some of the components of FIG. 1 have been omitted for simplicity and clarity in FIG. 4. Thus, in FIG. 4 only one of the loads 123 to 129, namely the load 123, is shown and only one of the switches 107 to 113, namely the switch 107, is shown. The apparatus 400 may include, in association with the switch 107 and the load 123, an auxiliary diagnosis arrangement which includes a further electrically controlled switch 401 and an auxiliary current source 403 which generates an output electrical current and voltage which may be used as a test electrical signal in response to an activating signal provided by the further switch 401. The further switch 401 is connected to the control logic unit 101 and may be operated by a control signal from the control logic 101. The switch 401 is connected in parallel with the switch 107 to the voltage source 105 and to the current source 403. The switch 401 thus activates the current source 403 when the switch 401 is in an On (conducting) state but not when it is in an Off (non-conducting) state. The current source 403 when activated may apply a test electrical signal to the output connection including the connection point 115 between the switch 107 and the load 123.

Each of the other combinations (not shown) of one of the electrical switches 109 to 113 and one of the loads 125 to 129 of the apparatus 400 includes an associated auxiliary diagnosis arrangement similar to that shown in FIG. 4 which includes the switch 401 and the current source 403. Each such arrangement is operated in a manner similar to that described below. A single electrical current source may be shared between each of the auxiliary arrangements.

During operation of the 'outputs connected' diagnosis mode using the apparatus 400, where a switch, e.g. 107, controlling a given output connection is already Off, the switch is not turned On as described with reference to the waveforms 201 to 207 shown in FIG. 2. Instead, the current source in each of the auxiliary diagnosis arrangements delivers a test electrical signal to the appropriate connection point. For example, the current source 403 delivers a test electrical signal to the connection point 115. The size and duration of the test electrical signal are not sufficient to provide suitable energization of the load, e.g. the load 123, connected to the current source. The test electrical signal is, however, suitable to raise the voltage at the connection point, e.g. point 115, sufficiently to allow detection that one of the other output connections points is shorted to that connection point. The test electrical signal is applied to each output connection in turn using a sequence similar to that described earlier with reference to FIG. 2. The current of the test electrical signal is preferably much less than the normal energising current through the load 123, which may be typically 100 to 2000 mA. The current of the test signal may for example be less than about 20 mA, e.g. about 10 mA or less.

This short to Vpwr detection using a test electrical signal from an auxiliary current source connected to the relevant output connection is available only in the case of an open load condition. Thus, the switch connected to the output connection investigated has to be Off. In the case where the load is already connected and energised, the short to ground diagnosis has to use a different procedure, e.g. as follows.

If the switch connected to the output connection is already On and the load connected to it is already energised, the connection has to be turned Off. The apparatus 400 may operate in the following way to achieve this. Assume that the output connection including the connection point 115 is already On and has to be turned Off. The 'Off command' signal produced by the control logic unit 101 may be applied to the switch 107 and to the arrangement 300 included in the detector 131 as described with reference to FIG. 3. The 'Off command' signal causes the switch 107 to be turned Off temporarily. The conversion of the switch 107 to its Off state takes place over a finite period of time during which the impedance of the switch 107 gradually increases. At the same time as applying the 'Off command' signal, the control logic 101 may apply a control signal to the switch 401 turning that switch On. In consequence, the current source 403 supplies an electrical test signal to the output connection between the switch 107 and the load 123. The current of the test signal is again much less, e.g. about 10 mA, than the normal energising current through the load 123. Any shorting to the voltage source 105 of the output connection between the switch 107 and the load 123 may be detected by detecting the voltage at the connection point 115 by the detector 131. If the load 123 presents a normal impedance because no fault is present, the voltage at the connection point 115 falls much more quickly than if the load 123 is open circuited owing to a short to the connection point 115 being present. The time taken for the fall in voltage to occur with no fault present can be much less than that required for the switch 107 fully to reach its Off state. In consequence, the variation of Vout required to show whether or not a fault is present owing to shorting can be limited to a small percentage, e.g. typically less than ten percent, of the normal energising voltage Vpwr from the voltage source 105. When the detection has been performed, the switch 107 may be immediately switched On again by provision of a control signal from the control logic unit 101.

Using the illustrative method 500 to be described below with reference to FIG. 5, it can be shown when using the apparatus 400 that a detected short appears in the diagnostic mode only when another one of the outputs is turned On, in a manner similar to that described earlier with reference to the waveforms 201 to 207 shown in FIG. 2. This fault condition therefore indicates a short between two output connections.

Figure 5:
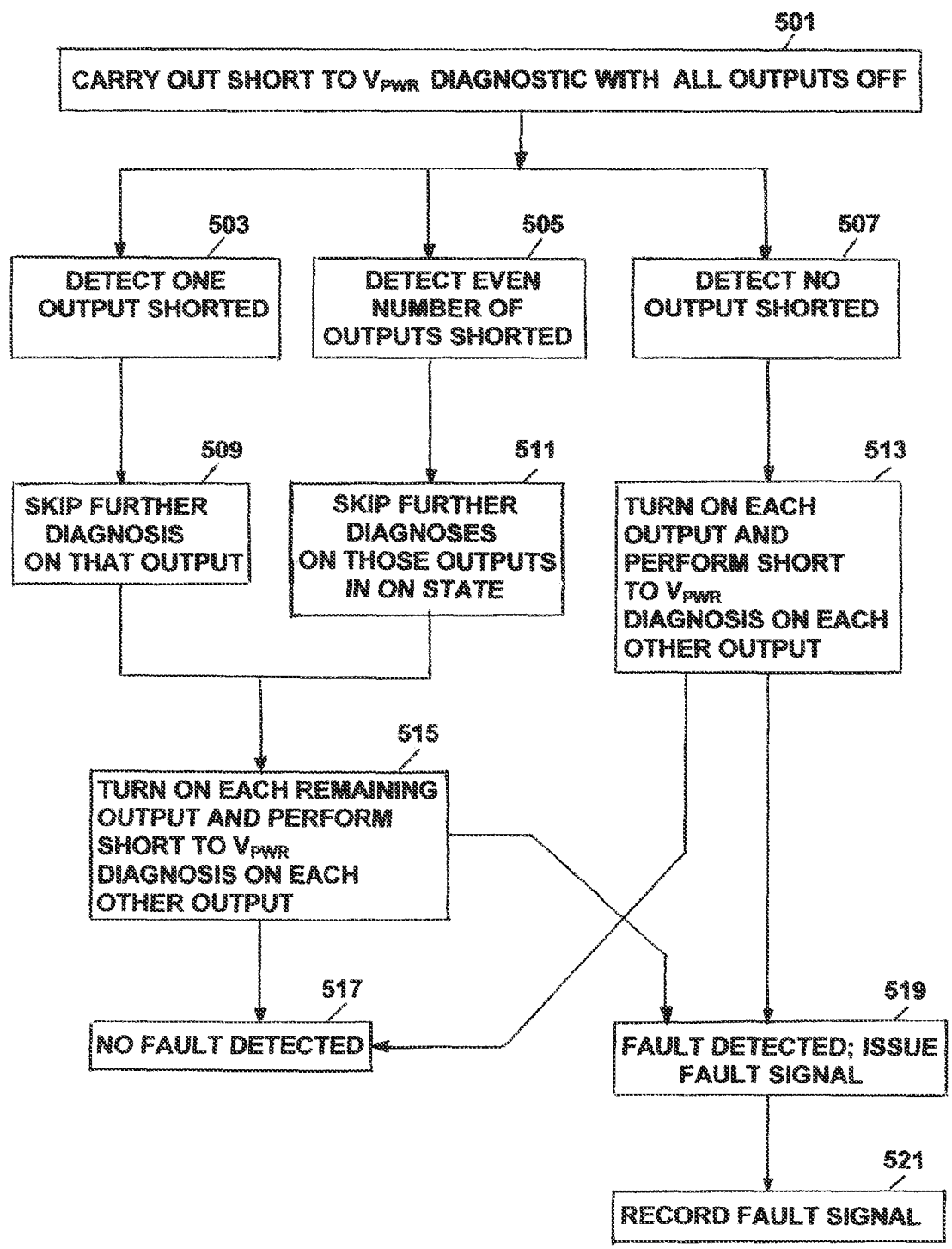
FIG. 5 is a flow chart of an illustrative method embodying the invention for fault diagnosis using the apparatus of FIG. 1 or of FIG. 4.

FIG. 5 is a flow chart of an illustrative method 500 which may be applied in the 'outputs connected' diagnosis mode in the apparatus 100. The method 500 may be applied on selected occasions by the controller 103 (FIG. 1) or at regular intervals, particularly when the apparatus 100 is in an operational mode, e.g. every t milliseconds, for example where t is between about 100 and 1000.

The method begins with as indicated with 501 in which a short to Vpwr diagnostic is carried out with all outputs (output connections) turned Off. This is a known procedure which is used to detect whether a short exists between any of the outputs and the voltage source 105 producing the voltage Vpwr. This procedure is useful to detect that such a short exists whether or not the diagnosis to detect outputs connected is continued. Where one output is shorted to Vpwr, the shorting of the output is detected in a step 503. Step 503 indicates that no other output is shorted to the detected output. Where an even number of outputs are shorted to Vpwr, the shorting of the outputs is detected as indicated with 505, indicating that the outputs are shorted together at Vpwr. Step 507 represents detection of the condition where no output is connected to Vpwr.

The method continues after 503 by skipping (omitting) further diagnosis on the output detected to be shorted to Vpwr. This is represented with 509 in FIG. 5.

The method continues after 505 by skipping further diagnosis in the On state of the even number of outputs detected to be shorted together at Vpwr. This is represented with 511.

Following 509 and 511, a procedure similar to that illustrated earlier with reference to FIG. 2 is carried out. As shown with 515, each remaining output is turned On and at the same time a short to Vpwr diagnosis is carried out for each other output. In addition, a short to Vpwr diagnosis in the off state may be carried out for the outputs found in 505 to be shorted together. The result of the diagnosis carried out in 515 is that no further fault is detected as represented by 517 or that a fault is detected as represented by a 519. A fault signal is also issued in 519 indicating that a short has been detected between two or more of the outputs other than at Vpwr.

Following 507, the procedure illustrated earlier with reference to FIG. 2 is carried out. In 513, each output is turned On and at the same time a short to Vpwr diagnosis is carried out for each other output. The result of the diagnosis carried out in 513 is that no further fault is detected as represented by the 517 or that a fault is detected as represented by a 519. A fault signal is also issued in 519 indicating that a short has been detected between two or more of the outputs. The fault signal issued in 519 may also indicate which of the outputs are shorted together.

Finally, in 521 following 519, a fault signal is recorded in the fault register 139 and is delivered to the controller 103.

A method similar to the method 500 may be carried out for 'outputs connected' diagnosis in the apparatus 400. However, in that case, the voltage Vpwr appearing in FIG. 5 is replaced by an energising voltage developed in the appropriate output connection by the test signal provided by the auxiliary current source 403, and each output is turned On by that voltage rather than a voltage derived from Vpwr.

The apparatus 100 and the apparatus 400 may be incorporated in known power switching devices particularly, but not exclusively, for use in automotive applications. The apparatus in each case may comprise a smart switch module, e.g. for controlling vehicle lights or serving as a main switch for a vehicle electrical system. The smart switch module (excluding the voltage source 105) or parts of it may be fabricated in the form of a semiconductor integrated circuit chip using well known fabrication technology. Thus, the apparatus 100 and the apparatus 400 may include components including the controller 103 and the control logic 101, and optionally other components shown in FIG. 1 or FIG. 4, in the form of a semiconductor integrated circuit.

The embodiments of the invention which have been described above provide one or more benefits as follows.

A fault condition may be detected in which outputs are shorted together but not at the power source (e.g. voltage source 105). Detection of the fault condition is particularly useful where an application operated by the apparatus 100 or 400 has to be tuned On most of the time, e.g. in the case of a relay which has to be kept On, or where an application operated by the apparatus 100 or 400 has to be turned Off most of the time. Detection of the fault condition by the relevant detector, e.g. one of the detectors 131 to 137, can be indicated by the detector as an alarm or interrupt signal to the controller 103. Detection of the fault condition may also be registered in the fault register 139, e.g. so that statistics relating to the incidence of the fault may be kept.

The controller 103 may in turn adapt overcurrent profiles and/or threshold levels controlled by the controller 103 in relation to an associated application. As a result of detecting the fault condition, the controller 103 may take action to protect an application running using the apparatus 100 or 400, e.g. by producing an alert signal to an operator and/or by automatically switching off an application to prevent current overload, and/or by operating a back-up device held in reserve.

The apparatus 100 may be used to give a fast diagnostic test when the apparatus is not operational to find a fault condition in which output connections are shorted together. For example, where the apparatus 100 is employed in a motor vehicle, the diagnostic test may be carried out during servicing of the vehicle in a garage. In contrast, the apparatus 400 may be used to give the diagnostic test during a period when the apparatus is in an operational mode. For example, where the apparatus 400 is employed in a motor vehicle, the diagnostic test using the apparatus may be carried out whilst the vehicle is running.

Further more significant benefit is that the dimensions of electrical cables extending to the loads 123 to 129 in the apparatus 100 or the apparatus 400 in some applications may be reduced, thereby reducing the cost of producing and supplying such cables and the space occupied by such cables, since the cables do not have to support a condition in which there is an unwanted excessive overcurrent caused by undetected shorting.

The invention may also be implemented in the form of a computer program for running on a programmable computer system comprising the controller 103 and the control logic 101 and optionally other components shown in FIG. 1 or FIG. 4, such as the fault register 139. The computer program may include at least code portions for performing steps of a method embodying the invention, e.g. as described with reference to FIG. 5, when run on the programmable computer system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-ROM or diskette, stored with data loadable in a memory of a computer system, the data representing the computer program. The data carrier may further be a data connection, such as a telephone cable or a wireless connection.

Because the apparatus implementing the present invention is, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention.

Although some embodiments of the invention have been described with respect to specific conductivity types or polarity of potentials, skilled artisans appreciated that conductivity types and polarities of potentials may be reversed.

Other modifications, variations and alternatives of the embodiments which have been described are possible. The Description and drawings are, accordingly, to be regarded in an illustrative rather than in a restrictive sense.

In the accompanying claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. Apparatus for detecting faults in the delivery of electrical power to electrical loads, comprising:
   a plurality of load electrical connections arranged to deliver electrical power from an electrical power source to each of a plurality of electrical loads;
   a plurality of electrical switches each connected to an associated one of the load electrical connections;
   a diagnostic device, wherein the diagnostic device applies a test electrical signal to a first one of the load electrical connections in an operational mode of the apparatus when a first switch of the plurality switches is in an off state, the first switch connected to the first one of the load electrical connections;
   a control logic unit operable, when the first switch in an off state, to deliver a control signal which puts other switches in an off state;
   a detector connected to the load electrical connections and operable to detect, when the test electrical signal is applied to the first one of the load electrical connections, and the control signal has been applied to the other switches to put the other switches in the off state, whether, in response, an electrical output indicating a short circuit connection to the first load electrical connection is produced on any other of the load electrical connections connected to the other switches in the off state.

2. The apparatus of claim 1 wherein the diagnostic device comprises:
   an auxiliary current source for providing the test electrical signal.

3. The apparatus of claim 2 wherein the auxiliary current source is operable to produce an output current having a magnitude and a duration which are not sufficient to energise a load to which the first one of the load electrical connections is connected.

4. The apparatus of claim 1 wherein operation of the detector is delayed by a delay after the diagnostic device begins applying the test electrical signal.

5. The apparatus of claim 4 wherein the detector stops detecting coincident with the diagnostic device stopping applying the test electrical signal.

6. The apparatus of claim 1 wherein the detector comprises:
   a deglitcher to avoid fault detection due to intermittent glitches or spikes.

7. The apparatus of claim 1 wherein operation of the detector is delayed by a delay after application of an off command to allow an output voltage provided to a second one of the load electrical connections to fall.

8. The apparatus of claim 1 wherein the diagnostic device is operable to begin application of the test electrical signal to a second electrical load connection substantially at the same time as application of the test electrical signal to a first one of the load electrical connections is ended and to begin detection of an electrical output in response on connections other than the second load electrical connection after a delay period following beginning of application of the test electrical signal to the second electrical load connection.

9. A method of fault detection in apparatus for delivering electrical power to electrical loads comprising an electrical power source and a plurality of load electrical connections arranged to deliver electrical power from the electrical power source to each of a plurality of electrical loads, the method comprising:

applying a test electrical signal to each of the load electrical connections in turn;

whilst applying the test electrical signal, detecting whether an electrical output is present at any of the other load electrical connections;

detecting by a diagnostic device connected to the load electrical connections, whilst the test electrical signal is applied to at least a first one of the load electrical connections, whether the electrical output is produced at a second one of the load electrical connections indicating a short circuit connection at the second one of the load electrical connections, wherein the detecting by the diagnostic device includes applying the test electrical signal to the first one of the load electrical connections in an operational mode of the apparatus when an electrically controlled switch connected to the first one of the load electrical connections is in an off state;

delivering, by a control logic unit, when the test electrical signal is applied to the electrically controlled switch connected to the first one of the load electrical connections, a control signal which puts other switches in an off state;

detecting, by the diagnostic device, when the electrically controlled switch is operated and the control signal has been applied to the other switches to put the other switches in an off state, whether, in response, a second electrical output indicating the short circuit connection is produced on any other of the load electrical connections connected to the other switches in the off state.

10. The method of claim 9 wherein the test electrical signal is provided by an auxiliary current source, wherein the auxiliary current source is operable to produce an output current having a magnitude and a duration which are not sufficient to energise a load to which the first one of the load electrical connections is connected.

11. The method of claim 9 wherein the detecting by the diagnostic device whether the electrical output is produced at the second one of the load electrical connections is delayed by a delay after application of an off command to allow an output voltage provided to the second one of the load electrical connections to fall.

12. The method of claim 9 wherein the diagnostic device is operable to begin application of the test electrical signal to the second one of the electrical load connections substantially at the same time as application of the test electrical signal to a first one of the load electrical connections is ended and to begin detection of an electrical output in response on connections other than the second one of the load electrical connections after a delay period following beginning of application of the test electrical signal to the second one of the electrical load connections.

13. A method of fault detection in apparatus for delivering electrical power to electrical loads comprising an electrical power source and a plurality of load electrical connections arranged to deliver electrical power from the electrical power source to each of a plurality of electrical loads, the method comprising a diagnostic procedure by a diagnostic device to detect a short circuit between at least two of the load electrical connections, the diagnostic procedure comprising:

applying a test electrical signal to each of the load electrical connections in turn; and whilst applying the test electrical signal to a first one of the load electrical connections, detecting whether an electrical output is present, in response, on any other of the load electrical connections, wherein the detecting by the diagnostic device includes applying the test electrical signal to the first one of the load electrical connections in an operational mode of the apparatus when an electrically controlled switch directly connected to the first one of the load electrical connections is in an off state.

14. The method of claim 13 wherein the test electrical signal is provided by an auxiliary current source.

15. The method of claim 14 wherein the auxiliary current source is operable to produce an output current having a magnitude and a duration which are not sufficient to energise a load to which the first one of the load electrical connections is connected.

16. The method of claim 13 wherein the detecting is delayed by a delay after the applying begins.

17. The method of claim 16 wherein the detecting ends coincident with an end of the applying.

18. The method of claim 13 wherein the detecting is subject to deglitching to avoid fault detection due to intermittent glitches or spikes.

19. The method of claim 13 wherein the detecting is delayed by a delay after application of an off command to allow an output voltage provided to a second one of the load electrical connections to fall.

20. The method of claim 13 wherein the diagnostic device is operable to begin application of the test electrical signal to a second one of the electrical load connections substantially at the same time as application of the test electrical signal to a first one of the load electrical connections is ended and to begin detection of an electrical output in response on connections other than the second one of the load electrical connections after a delay period following beginning of application of the test electrical signal to the second one of the electrical load connections.

* * * * *